US012777743B2

(12) United States Patent
Rol et al.

(10) Patent No.: US 12,777,743 B2
(45) Date of Patent: Oct. 27, 2026

(54) METHOD FOR MANUFACTURING A GROWTH SUBSTRATE INCLUDING MESAS OF VARIOUS DEFORMABILITIES, BY ETCHING AND ELECTROCHEMICAL POROSIFICATION

(71) Applicant: COMMISSARIAT À L'ÉNERGIE ATOMIQUE ET AUX ÉNERGIES ALTERNATIVES, Paris (FR)

(72) Inventors: Fabian Rol, Grenoble (FR); Amélie Dussaigne, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 372 days.

(21) Appl. No.: 18/545,026

(22) Filed: Dec. 19, 2023

(65) Prior Publication Data

US 2024/0213398 A1 Jun. 27, 2024

(30) Foreign Application Priority Data

Dec. 21, 2022 (FR) .................................... 2214167

(51) Int. Cl.
*H01L 33/00* (2010.01)
*H01L 27/146* (2006.01)
(Continued)

(52) U.S. Cl.
CPC ....... *H10H 20/0137* (2025.01); *H10F 39/026* (2025.01); *H10H 20/825* (2025.01);
(Continued)

(58) Field of Classification Search
CPC .. H10H 20/0137; H10H 20/01; H10H 20/825; H10H 20/815; H10H 20/819;
(Continued)

(56) References Cited

U.S. PATENT DOCUMENTS 11,329,188 B2 * 5/2022 Benaissa ................ H10H 20/01
12,336,326 B2 * 6/2025 Chen .................. H10H 20/0137
(Continued)

FOREIGN PATENT DOCUMENTS

| | | | |
|---|---|---|---|
| CN | 115483321 | A | 12/2022 |
| EP | 3 840 065 | A1 | 6/2021 |
| EP | 4 105 999 | A1 | 12/2022 |

OTHER PUBLICATIONS

Search Report for French Application No. 2214167 dated Jul. 7, 2023.

(Continued)

*Primary Examiner* — Nikolay K Yushin
(74) *Attorney, Agent, or Firm* — Chrisman Gallo Tochtrop LLC

(57) ABSTRACT

A method for manufacturing a growth substrate adapted to produce by epitaxy a matrix of diodes based on InGaN, including the following steps of:

- producing a crystalline stack including, from a conductive buffer layer: a lower layer based on doped GaN; then a separation intermediate layer, based on InGaN; then an upper layer (14) based on AlGaN;
- producing mesas of three categories M1, M2, M3, by localised etching of the crystalline stack;
- eliminating, by etching, the upper portion of at least the mesas M3, the upper portion of the mesas M1 being preserved; then
- non-photo-assisted electrochemically porosifying the lower portions of only the mesas M1 and M3, the lower portion of the mesas M2 being non-porosified.

13 Claims, 6 Drawing Sheets

(51) Int. Cl.

| | |
|---|---|
| ***H10F 39/00*** | (2025.01) |
| ***H10H 20/01*** | (2025.01) |
| ***H10H 20/825*** | (2025.01) |
| ***H10H 29/14*** | (2025.01) |
| *H10H 20/815* | (2025.01) |
| *H10P 50/24* | (2026.01) |
| *H10P 50/64* | (2026.01) |

(52) U.S. Cl.
CPC ........... *H10H 29/14* (2025.01); *H10H 20/815* (2025.01); *H10P 50/242* (2026.01); *H10P 50/646* (2026.01)

(58) Field of Classification Search
CPC .... H10H 29/142; H10H 29/14; H10H 29/857; H10H 29/942; H10H 29/8325; H10F 39/026; H10F 39/00; H10F 39/8017; H10F 39/802; H10F 39/811; H10F 39/182; H10P 50/242; H10P 50/24; H10P 50/646; H10P 50/64; H10P 50/00; H10P 50/617; H10P 50/61
See application file for complete search history.

(56) References Cited

U.S. PATENT DOCUMENTS

| | | | | |
|---|---|---|---|---|
| 2021/0050476 | A1* | 2/2021 | Benaissa | H10H 20/01 |
| 2021/0193870 | A1 | 6/2021 | Pernel | |
| 2022/0208848 | A1* | 6/2022 | Tan | H10H 20/817 |
| 2022/0285584 | A1 | 9/2022 | Khoury et al. | |
| 2023/0290806 | A1* | 9/2023 | Zhu | H10H 20/01335 |
| 2023/0402565 | A1* | 12/2023 | Chen | H10H 20/0137 |
| 2024/0030275 | A1* | 1/2024 | Avramescu | H10H 20/812 |
| 2024/0153986 | A1* | 5/2024 | Dupre | H10H 29/142 |
| 2024/0213398 | A1* | 6/2024 | Rol | H10H 20/0137 |

OTHER PUBLICATIONS

P. H. Griffin, et al., “Porous nitride semiconductors reviewed”, Journal of Physics, D: Appl. Phys. vol. 53, 383002, (2020), DOI 10.1088/1361-6463/ab9570.

* cited by examiner

METHOD FOR MANUFACTURING A GROWTH SUBSTRATE INCLUDING MESAS OF VARIOUS DEFORMABILITIES, BY ETCHING AND ELECTROCHEMICAL POROSIFICATION

CROSS-REFERENCE TO RELATED APPLICATIONS

This application claims the priority of French Patent Application No. FR2214167, filed Dec. 21, 2023, which is incorporated herein by reference in its entirety.

TECHNICAL FIELD

The field of the invention is that of methods for manufacturing a growth substrate including mesas, and for producing a matrix of diodes adapted to emit or detect, natively, light radiation at various wavelengths.

PRIOR ART

Methods exist for manufacturing a matrix of light-emitting diodes adapted to emit, natively, light radiation at various wavelengths. The matrix of diodes can then include diodes adapted to emit a red light, other diodes a green light, and also others a blue light. Such a matrix of diodes then forms a microscreen with native RGB (standing for Red, Green, Blue) emission.

The diodes are said to have native emission, in that the active zone of each diode emitting at a given wavelength differs from the active zones of the diodes emitting at another wavelength. In the case of diodes produced based on InGaN, the active zones differ from one another through the proportion of indium in the quantum wells.

Such a matrix of native-emission diodes is thus distinguished from colour-conversion technologies where the diodes all emit at the same wavelength, for example in the blue, and are each covered with a pad including luminophores, for example semiconductor nanocrystals forming quantum boxes, to at least partly convert the incident light into a light of another wavelength.

To manufacture a matrix of native-emission diodes, one approach consists in using a growth substrate having mesas having been partly made porous during an electrochemical porosification step. This electrochemical porosification technique is presented in particular in the article by Griffin and Oliver entitled *Porous nitride semiconductors reviewed*, J. Phys. D: Appl. Phys. 53 (2020) 383002.

The document EP3840065A1 describes an example of a method for manufacturing a growth substrate and then a matrix of diodes using the electrochemical porosification technique. The method includes producing a growth substrate (also called pseudo-substrate) having a plurality of mesas made from InGaN, each formed by a doped portion of InGaN made porous during an electrochemical porosification step, and an InGaN epitaxial regrowth portion not intentionally doped or weakly doped so that it is not porosified (it remains integral or dense, and therefore non-porous). The diodes are next produced by epitaxy from epitaxial regrowth portions.

The doped portions of the mesas can have different doping levels from one mesa to another, so that the mesas have different porosification levels and therefore different degrees of relaxation. The diodes produced from the various mesas then include quantum wells having a greater or lesser proportion of indium, thus making it possible to obtain emissive pixels at various wavelengths.

However, to obtain mesas the doped InGaN layers of which have various doping levels from one mesa to another, it is necessary to carry out, before the step of producing the mesas, a step of spatially localised implantation of dopants in a full layer of InGaN, which makes the manufacturing method more complex.

DISCLOSURE OF THE INVENTION

The objective of the invention is to at least partly remedy the drawbacks of the prior art, and more particularly to propose a method for manufacturing a growth substrate, adapted to produce a matrix of diodes based on InGaN, and including mesas of different deformabilities, without it being necessary to perform spatially localised implantations of dopants. These mesas of various deformabilities thus make it possible to natively produce diodes based on InGaN that can each emit or detect light radiation at various wavelengths, for example in the three RGB colours.

For this purpose, the object of the invention is a method for manufacturing a growth substrate adapted to produce by epitaxy a matrix of diodes based on InGaN, including the following steps of:

- producing a crystalline stack based on GaN, including, from a conductive buffer layer produced based on doped GaN: a lower layer based on doped GaN; then a separation intermediate layer, based on InGaN; then an upper layer based on AlGaN;
- producing mesas of three categories M1, M2, M3, by localised etching of the crystalline stack, each mesa then being formed of a stack of a lower portion, of a separation intermediate portion, and of an upper portion, respectively from the lower layer, from the separation intermediate layer and from the upper layer;
- eliminating, by etching, the upper portion of at least the mesas M3, the upper portion of the mesas M1 being preserved; then
- non-photo-assisted electrochemically porosifying the lower portions of only the mesas M1 and M3, the lower portion of the mesas M2 being non-porosified.

Some preferred yet non-limiting aspects of this manufacturing method are as follows.

The elimination step can be performed by photoelectrochemically etching the separation intermediate portion of at least the mesas M3, the mesas M1 being covered by an encapsulation layer.

The elimination step can be performed by dry etching the upper portion of at least the mesas M3, with etch stop on the separation intermediate portion, the mesas M1 being covered by an etching mask.

After the step of producing the mesas, the separation intermediate portion can be, in each mesa, on and in contact with the lower portion, the method then including a step of producing epitaxial regrowth portions produced based on InGaN, carried out after the electrochemical porosification step, resting on the upper portion in the mesas M1, and resting on the lower portion in the mesas M3.

The method may include, after the elimination and porosification steps and before the step of producing the epitaxial regrowth portion, a step of producing a sealing portion deposited at least on and in contact with the lower portion of the mesas M3 then porosified.

During the step of producing the crystalline stack, an epitaxial regrowth layer may be located on and in contact with the lower layer, so that, after the elimination and porosification steps, the mesas M3 have an upper face formed by an epitaxial regrowth portion from the epitaxial regrowth layer.

The invention also relates to a method for manufacturing a matrix of diodes of categories D1, D2, D3 from a growth substrate, including the following steps of: manufacturing the growth substrate by the method according to any one of the preceding features; then depositing a growth mask, leaving free an upper surface of the mesas M1, M2, M3; then producing the matrix of diodes D1, D2, D3, respectively from the mesas M1, M2, M3.

The invention also relates to a growth substrate adapted to produce by epitaxy a matrix of diodes based on InGaN, including:

- a conductive buffer layer, produced based on doped GaN;
- mesas of three categories M1, M2, M3, resting on the conductive buffer layer, each including a lower portion produced based on doped GaN, and
  - the mesas M1 further including a non-porous separation intermediate portion and produced based on InGaN, resting on the porous lower portion; then a non-porous upper portion and produced based on AlGaN;
  - the mesas M2 being formed of the non-porous lower portion;
  - the mesas M3 being formed of the porous lower portion, and not including the non-porous upper portion produced based on AlGaN resting on the lower portion.

Each mesa M1, M2, M3 may include a non-porous epitaxial regrowth portion produced based on doped InGaN, resting, in the mesas M1, on the upper portion, and, in the mesas M3, on the lower portion.

Each mesa M1, M2, M3 may include a non-porous sealing portion produced based on GaN, located, in the mesas M1, between and in contact with the upper portion and with the epitaxial regrowth portion, and in the mesas M3, between and in contact with the lower portion and with the epitaxial regrowth portion.

Each mesa M1, M2, M3 may include an epitaxial regrowth intermediate portion produced based on InGaN and located, in the mesas M1, between the lower portion and the separation intermediate portion, in the mesas M3, on the lower portion.

The epitaxial regrowth intermediate portion of each mesa M1, M2, M3 may be non-porous.

The epitaxial regrowth intermediate portion may be porous in the mesas M1, and non-porous in the mesas M2 and M3.

BRIEF DESCRIPTION OF THE DRAWINGS

Other aspects, aims, advantages and features of the invention will appear better upon reading the following detailed description of preferred embodiments thereof, given as a non-limiting example, and made with reference to the appended drawings, wherein.

DETAILED DISCLOSURE OF PARTICULAR EMBODIMENTS

Figure 1A:
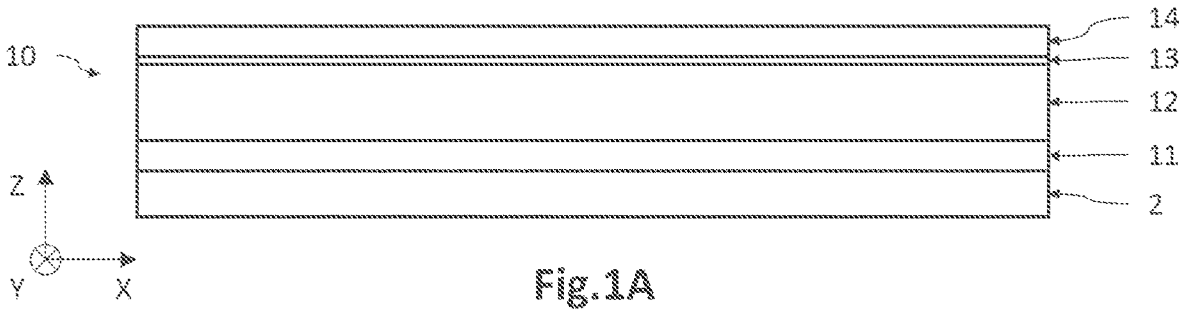
FIGS. 1A to 1H illustrate steps of a method for manufacturing a growth substrate, then a matrix of diodes, according to a first embodiment where the step of eliminating the upper portions based on AlGaN is carried out by photoelectrochemical etching.

In the figures and in the following the description, the same references represent identical or similar elements. In addition, the various elements are not shown to scale in such a way as to promote clarity of the figures. Moreover, the different embodiments and variants are not mutually exclusive and could be combined together. Unless indicated otherwise, the terms "substantially", "approximately", "in the order of" mean within a 10% margin, and preferably within a 5% margin. Moreover, the terms "between . . . and . . . " and equivalents mean that the bounds are included, unless stated otherwise.

The invention relates to a growth substrate and the method for manufacturing same. The growth substrate is adapted to produce by epitaxy a matrix of diodes based on InGaN, the diodes making it possible to emit or to detect, natively, light radiation at various wavelengths, for example of RGB (red, green, blue) type.

The growth substrate includes mesas of at least three different categories, noted M1, M2 and M3, having various deformabilities d1, d2, d3, depending on whether or not the mesas include an upper portion based on AlGaN, and depending on whether they include a lower portion based on GaN and/or a porosified or non-porosified epitaxial regrowth portion based on InGaN. Generally, deformability is the ability of the mesa to deform during the production of the diode.

The various deformabilities d1, d2, d3 of the mesas result in the fact that the mesas M1, M2, M3 then have various values of the effective mesh parameter, from one category of mesa to another, at their upper face, during the growth of the diodes. The effective mesh parameter is the mesh parameter, defined in a main XY plane (orthogonal to the growth axis of the layers), of the layer or layer portion considered. In addition, the diodes of categories D1, D2 and D3, produced during the same epitaxy step from the growth substrate, will have different active zones in terms of proportion of indium incorporated into the quantum wells, and therefore will be adapted to emit or detect light radiation at various wavelengths.

The manufacturing method proposes to firstly produce mesas M1, M2, M3 based on GaN, each including a lower portion based on GaN, a so-called separation intermediate portion based on InGaN, and an upper portion based on AlGaN. Then, the upper portion based on AlGaN of at least the mesas M3, and possibly also of the mesas M2, are eliminated by etching, whereas they are kept in the mesas M1. This elimination step may be, in a first embodiment, carried out by photoelectrochemically etching the separation intermediate portion based on InGaN, or, in a second embodiment, carried out by dry etching the upper portions based on AlGaN with etch stop on the separation intermediate portions based on InGaN. The method also envisages porosifying by electrochemical porosification the lower portions of only the mesas M1 and M3, whereas they are not porosified in the mesas M2.

It should be stated that the photoelectrochemical etching is carried out by immersing the growth substrate in a liquid electrolyte, and by illuminating the mesas with an excitation light beam capable of being absorbed only by the separation intermediate portions. The material of these intermediate portions is then oxidised and dissolved by the liquid electrolyte. A low electrical voltage $V_{PECE}$ can be applied to collect the photogenerated electrons. Moreover, it should also be stated that the electrochemical porosification (porosification by electrochemical anodisation) is carried out also by immersing the growth substrate in a liquid electrolyte. An electrical voltage of a higher value $V_{ECE}$ is applied, causing the porosification of these desired layer portions. Within the scope of the invention, the electrochemical porosification is non-photo-assisted.

It should be stated here that an electrochemical porosification reaction is a selective reaction in that, for the same electrical voltage $E_p$ of value $V_{ECE}$, a crystalline semiconductor material based on GaN will be porosified if its doping level $N_D$ is higher than or equal to a predefined minimum doping level $N_{D,min}(V_{ECE})$. Otherwise, it will not be porosified and will remain integral (dense). In this regard, the document EP3840016A1 illustrates an example of the domain of existence of electrochemical porosification as a function of the doping level $N_D$ (here in donors) of the crystalline material based on GaN and of the electrical voltage $V_{ECE}$ applied.

Thus, a growth substrate is obtained, where:

- the mesas M2 have a minimal deformability d2, insofar as they do not include porosified portions. The effective mesh parameter $a_{M2}$ is that of a conductive buffer layer based on GaN whereon the mesas rest (by way of a slight relaxation related to the production of mesas). Preferably, this will therefore give: $a_{M2} \approx a_{GaN}$;
- the mesas M1 have a deformability d1 greater than d2, insofar as they include a porosified lower portion based on GaN and a non-porosified upper portion based on AlGaN. This then forces the mesas M1 in compression, and leads to an effective mesh parameter $a_{M1}$, during the production of the diodes, lower than that of the mesas M2: $a_{M1} < a_{M2}$;
- the mesas M3 also have a deformability d3 greater than d2, insofar as they include a porosified lower portion based on GaN. The mesas M3 also include a non-porosified epitaxial regrowth portion based on InGaN, which then generates tensile stress of the mesas M3, and leads to an effective mesh parameter $a_{M1}$, during the production of the diodes, greater than that of the mesas M2: $a_{M3} > a_{M2}$.

FIGS. 1A to 1H illustrate steps of a method for manufacturing a growth substrate 20, then a matrix of diodes, according to a first embodiment where the step of separating the upper portions 24 based on AlGaN is carried out by photoelectrochemical etching. The matrix of diodes forms, in this example, a microscreen with native RGB emission.

An orthogonal three-dimensional direct reference frame XYZ is defined here and in the following description, where the X and Y axes form a main plane of the support substrate 2 and where the Z axis is oriented across the thickness of the growth substrate 20 in the direction of the mesas.

With reference to FIG. 1A, a crystalline stack 10 based on GaN resting on a support substrate 2 is produced. In general, "material based on GaN" means that the material can be GaN or can be a ternary or quaternary compound of GaN. It can thus, in general, be $In_xAl_yGa_{1-x-y}N$ where the proportion of indium x can be zero and where the proportion of aluminium y can also be zero. On the other hand, "material based on InGaN" means that it is made from InGaN or from InAlGaN, that is to say that it can be produced from $In_xAl_yGa_{1-x-y}N$ where the proportion of indium x is non-zero and where the proportion of aluminium y can be zero. Likewise, "material based on AlGaN" means that it is made from AlGaN or from InAlGaN, that is to say that it can be produced from $In_xAl_yGa_{1-x-y}N$ where the proportion of indium x can be zero and where the proportion of aluminium y is non-zero.

The support layer 2 is here produced from a non-porosifiable material, so that it remains non-porous (dense) during the subsequent porosification of the mesas M1 and M3. It may be a material inert to the electrochemical porosification reaction, such as an insulating material (sapphire, etc.) or a semiconductor material (SiC, Si, etc.) not intentionally doped (nid) or weakly doped. It may also be a semiconductor material based on GaN not intentionally doped or weakly doped so as not to be porosifiable at the porosification voltage $V_{ECE}$. By way of example, the support layer can be produced from freestanding sapphire, silicon, SiC or GaN, among others. It has a thickness for example between approximately 200 μm and approximately 1.2 mm. Intermediate layers can be present between the support substrate 2 and the conductive buffer layer 11, produced for example based on AlN. Thus, by way of examples, the following stacks can be used: Si/AlN/AlGaN/GaN; sapphire/nid GaN; SiC/AlN/AlGaN etc., the support substrate 2 may be absent if the conductive buffer layer 11 has a thickness that is sufficient to ensure the mechanical strength of the growth substrate 20.

The crystalline stack 10 includes a conductive buffer layer 11, whereon the mesas M1, M2, M3 rest and that will make it possible to apply an electrical potential to the lower portions 22 of the mesas from a biasing electrode 3. For this purpose, the conductive buffer layer 11 is produced from a crystalline material based on doped GaN (here n-type) over at least one part of its thickness, with for example a doping level of $10^{18}$ $cm^{-3}$. The conductive buffer layer 11 is produced by epitaxy from the support substrate 2. It can have a thickness of between approximately 1 and 10 μm. With this doping level, the conductive buffer layer 11 is not porosified during the subsequent electronic porosification step (with the electrical voltage in the order of approximately 15 V), and makes the circulation of the charge carriers possible.

The lower layer 12 rests on the conductive buffer layer 11 and is in electrical contact with it (and here in physical contact). It is intended to form the lower portions 22 of the mesas, of which only the lower portions 22 of the mesas M1 and M3 will be porosified. It is produced based on GaN, and can, in general, be produced in $In_xGa_{1-x}N$ with a proportion of indium x, positive or zero, lower than that of the separation intermediate layer 13 so as not to absorb the excitation light beam during the subsequent photoelectrochemical etching step. It is sufficiently doped in order that the lower portions 22 of the mesas M1 and M3 are porosified during the subsequent electrochemical porosification step. In this example, it is produced from n-type doped GaN with a doping level of approximately $6 \times 10^{18}$ $cm^{-3}$. Its thickness is in the order of several hundreds of nanometres to make a good relaxation of the mechanical stresses of the mesas M1 and M3 possible, for example at least equal to 500 nm, and here is equal to approximately 1000 nm.

The separation intermediate layer 13 rests on the lower layer 12, and here is in contact with it. It is intended to be etched, during the subsequent photoelectrochemical etching step, to ensure the removal of the upper portions 24 of only the mesas M2 and M3 (and not of the mesas M1). Therefore, it is a sacrificial layer. It is produced based on $In_xGa_{1-x}N$, with a non-zero proportion of indium x greater than those of the lower 12 and upper layers 14, for example between 10 and 15%, to be the only one to absorb the excitation light beam during the subsequent photoelectrochemical etching step. In other words, its band gap energy is lower than that of the lower 12 and upper layers 14. In this example, it is produced from InGaN not intentionally doped, with a proportion of indium x of approximately 15%. Its thickness is in the order of a few nanometres, for example of approximately 3 nm. It can thus form a single quantum well or a plurality of quantum wells. It should be noted that InGaN porosifies at an electrical voltage $V_{ECE}$ lower than that of GaN, with equivalent doping level. The proportion of indium x and the doping level are selected here in order that the separation intermediate portion 23 is not porosified during the porosification step of FIG. 1E.

The upper layer 14 rests on the separation intermediate layer 13, and here is in contact with it. It is intended to form the upper portions 24 of the mesas, of which that of the mesas M3 will be eliminated (and here also that of the mesas M2) during the subsequent photoelectrochemical etching step, and that of the mesas M1 will be kept. It is produced based on $Al_yGa_{1-y}N$, with a non-zero proportion of aluminium y, greater than those of the lower 12 and intermediate layers 13. The doping level is selected in order that the upper portion 24 of the mesas M1 is not porosified during the subsequent electrochemical porosification step. Therefore, the material may be not intentionally doped or weakly doped. In this example, it is produced from AlGaN not intentionally doped with a proportion of aluminium y of approximately 10%. Its thickness is in the order of around one hundred nanometres, for example of approximately 100 nm. It should be noted that the upper layer 14 can be covered with a thin protective layer (not shown), for example made from GaN or from InGaN of a thickness in the order of 1 to 3 nm, to avoid the oxidation of AlGaN.

Here, it should be noted that the lower 12, intermediate 13 and upper layers 14 each have a thickness lower than their critical thickness at which there is a plastic relaxation of the mechanical stresses. The total thickness of the crystalline stack 10 is also lower than a predefined critical thickness. Thus, the conductive buffer layer 11 generates, in the lower 12, intermediate 13 and upper layers 14, mechanical stresses (oriented in the XY plane) the value of which is such that, before porosification, the effective mesh parameter is close or substantially equal to the effective mesh parameter of the conductive buffer layer 11, here substantially equal to that of the relaxed GaN (or slightly in compression if it is produced from sapphire).

Figure 1B:
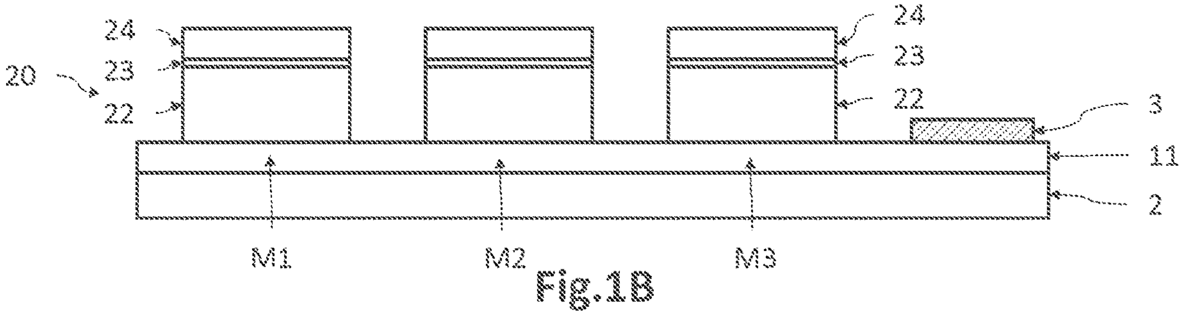

With reference to FIG. 1B, the mesas M1, M2 and M3 are produced by structuring the crystalline stack 10 by lithography and localised etching. The etching is carried out here until opening onto the upper face of the conductive buffer layer 11. The etching may be a dry etching, for example of ICP-RIE plasma type with chlorine gas, so that the sidewalls of the mesas are substantially vertical. Each mesa is formed of a stack, in the +Z direction, of a lower portion 22 based on GaN (from the lower layer 12), of a separation intermediate portion 23 based on InGaN (from the intermediate layer 13), and of an upper portion 24 based on AlGaN (from the upper layer 14). Insofar as the mesas are produced from the same crystalline stack 10, each portion of a mesa is coplanar with the corresponding portions of the other mesas and has the same thickness.

Next, a biasing electrode 3 is deposited on and in contact with the conductive buffer layer 11, which makes it possible to apply an electrical potential to the mesas.

Figure 1C:
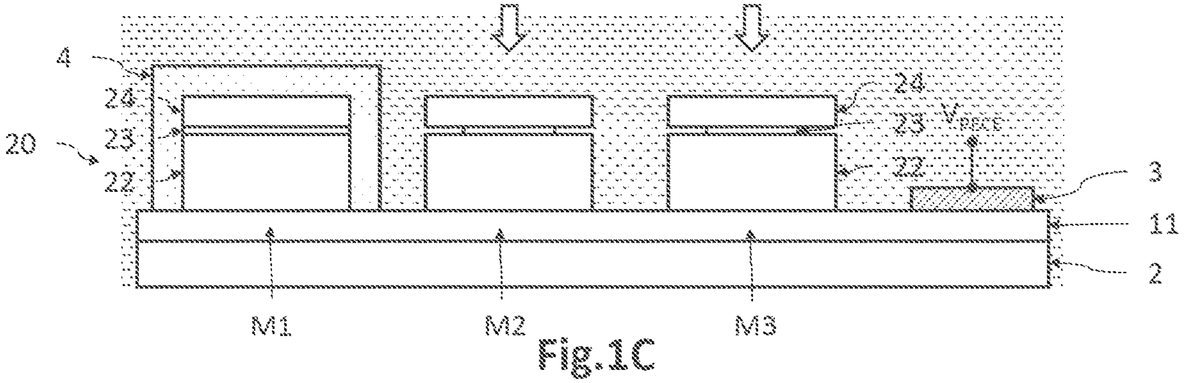

With reference to FIG. 1C, the upper portions 24 of at least the mesas M3 (and here also of the mesas M2), and not of the mesas M1, are eliminated. In this embodiment, this elimination is obtained by the photo-assisted electrochemical etching of the entire intermediate portion 23 of the mesas M2 and M3. On the other hand, the mesas M1 are protected by an encapsulation layer 4 preventing the etching of the intermediate portion 23 of the mesas M1.

For this purpose, firstly the encapsulation layer 4 is deposited on the mesas M1, in such a way as to completely cover them. The mesas M2 and M3 are not covered by this layer 4. This may be a photosensitive resin, or even a conformal layer of an oxide. The intermediate portion 23 of the mesas M1 will therefore not be in contact with the liquid electrolyte.

Next, the etching of the intermediate portions 23 of the mesas M2 and M3 is carried out. The growth substrate 20 is immersed in a liquid electrolyte making it possible to dissolve the oxidised InGaN formed by the absorption of the excitation light beam. The liquid electrolyte can be acidic or basic, and can be oxalic acid. It can also be KOH, HF, $HNO_3$, $NaNO_3$, $H_2SO_4$ or a mixture thereof. It is thus possible also to use a mixture of oxalic acid and $NaNO_3$. The growth substrate 20 is also subjected to an excitation light beam the spectrum of which makes it possible to only excite the intermediate portion 23. It may be a white light lamp associated with a filter, an LED, or even a laser source. Thus, a laser at 405 nm can be used to only excite the intermediate portions 23 made from InGaN with 15% of indium. Moreover, an electrical voltage $V_{PECE}$ can be applied by an electrical generator between the biasing electrode and a counter-electrode inserted in the electrolyte (for example, a platinum grid or wire). It can also be for example at 2 V. This electrical voltage $V_{PECE}$ makes it possible to improve the collection of photogenerated electrons.

Figure 1D:
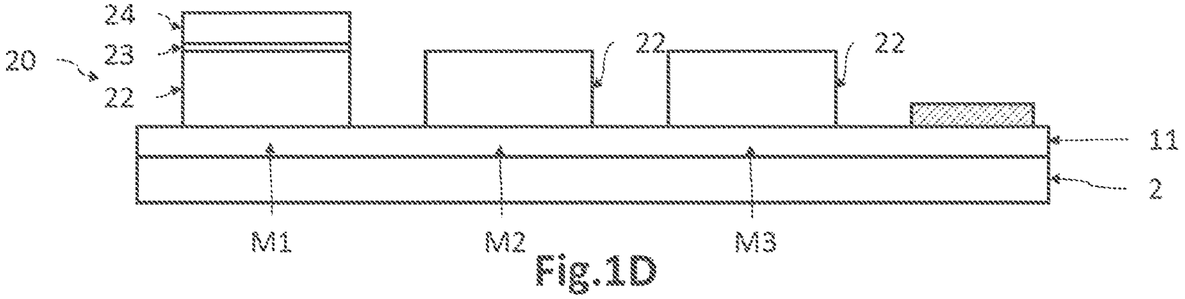

With reference to FIG. 1D, after the photoelectrochemical etching elimination step, the encapsulation layer 4 is removed. The mesas M2 and M3 have therefore lost their upper portion 24, due to the total etching of the intermediate portions 23. The upper face therefore corresponds to that of the lower portions 22. On the other hand, the upper face of the mesas M1 still corresponds to the upper portion 24 (or to the thin protective portion).

Figure 1E:
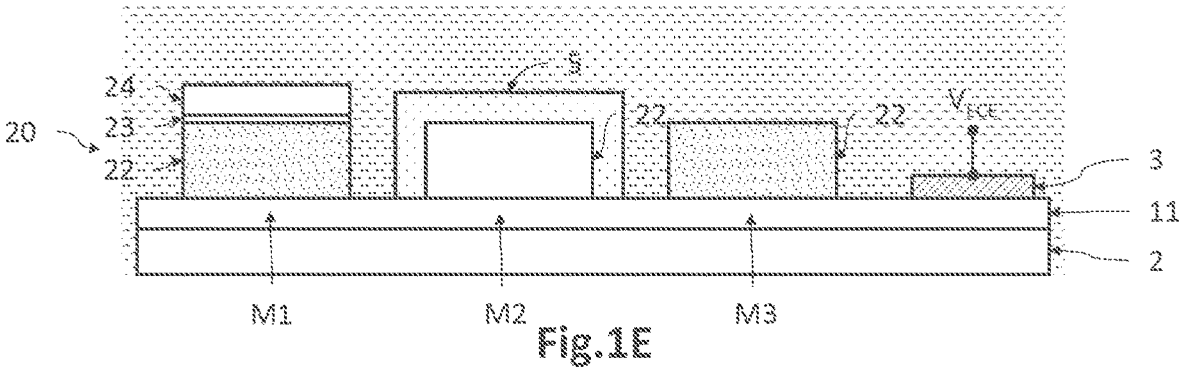

With reference to FIG. 1E, an electrochemical porosification, non-photo-assisted, of the lower portions 22 of only the mesas M1 and M3, and not those of the mesas M2 is carried out. For this purpose, an encapsulation layer 5 is deposited on only the mesas M2, for example a photosensitive resin or an oxide or silicon nitride layer (conformal deposition). Thus, the mesas M2 will not be in contact with the liquid electrolyte. On the other hand, the mesas M1 and M3 are not covered by this encapsulation layer 5.

Next, the growth substrate 20 is once again immersed in a liquid electrolyte. The biasing electrode 3 is then connected to the electrical generator in such a way as to apply an electrical voltage of value $V_{ECE}$, for example here equal to 15 V. This results in a porosification of the lower portions 22 of the mesas M1 and M3, which alone are in contact with the liquid electrolyte. The lower portion 22 of the mesa M2 therefore is not porosified. The electrical voltage can be applied for a period ranging from a few seconds to a few hours. A reference electrode can be used to precisely control the electrical voltage applied. During this step, there is no emission of the excitation light beam in the direction of the mesas. Next, the growth substrate 20 is removed from the electrolytic bath, and the encapsulation layer 5 is removed.

Thus, a growth substrate 20 is obtained, of which the mesas, which have various deformabilities, have been obtained from the same initial crystalline stack 10. It is therefore adapted to produce by epitaxy a matrix of diodes making it possible to emit or to receive light radiation at various wavelengths natively, in particular after having produced epitaxial regrowth portions 27 based on InGaN.

Thus, the mesas M2 have a minimal deformability d2, due to the fact that it is not porosified. In this example, it no longer includes the upper portion 24 based on AlGaN. Alternatively, as indicated above, it may have kept it, in which case the upper portion 24 would not be porosified (like the lower portion 22). In any case, the mesas M2 have an effective mesh parameter that is substantially equal to that of the conductive buffer layer 11, or even is substantially equal to the mesh parameter of the relaxed material of the layer 11, due to the low relaxation of the mesas during their production (FIG. 1B). They will make it possible to produce diodes D2 emitting for example in green.

The mesas M1 have a deformability d1 greater than d2 due to the porosification of the lower portion 22. In addition, the porosified lower portion 22 makes it possible for the mesas M1 to relax under the effect of the mechanical compressive stresses generated by the non-porosified upper portion 24 based on AlGaN, so that the effective mesh parameter is then lower than that of the mesas M2. However, after this relaxation, the portion 24 will limit the deformation of the mesa M1 during the production of the diodes, and therefore limit the incorporation of indium. The mesas M1 will make it possible to produce diodes D1 emitting for example in blue.

Finally, the mesas M3 have a deformability d3 greater than d2 and different from d1, due to the porosification of the lower portion 22 and to the absence of the upper portion 24 based on AlGaN. The mesas M3 may have, during the production of the epitaxial regrowth portion 27 based on InGaN, an effective mesh parameter greater than that of the mesas M2 due to the mechanical tensile stresses generated by the portion 27. The mesas M3 will make it possible to produce diodes D3 emitting for example in red.

Figure 1F:
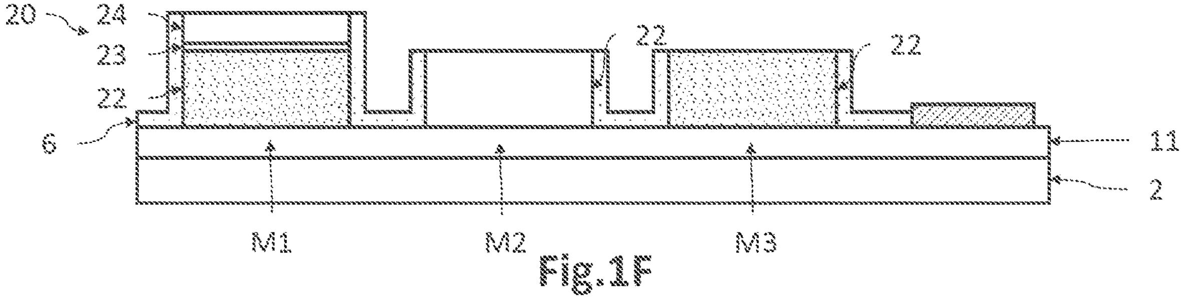

With reference to FIG. 1F, the matrix of diodes is next produced by epitaxial regrowth from the mesas of the growth substrate 20. Firstly, a growth mask 6, produced in a dielectric material, is here conformally deposited (for example by PECVD), in such a way as to cover the sidewalls of the mesas as well as the conductive buffer layer 11. The growth mask 6 can be produced, for example, from a silicon nitride or from a dual-layer of a nitride and of a silicon oxide of a thickness of approximately 80 nm. Only one surface of the upper faces of the mesas M1, M2, M3 is left free by the growth mask 6, in such a way as to form a germination surface. Next, an annealing in ammonia and at high temperature (e.g. between 750 and 900° C.) can be carried out to clean the upper surfaces of the mesas M1, M2, M3.

Figure 1G:
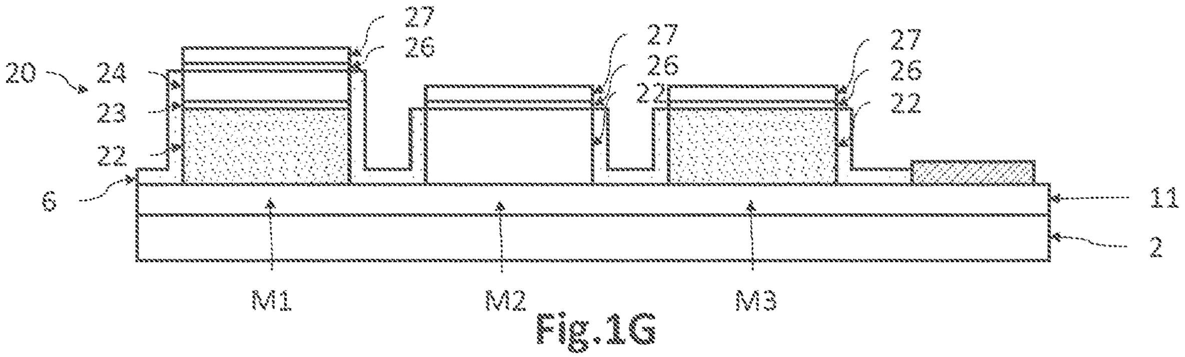

With reference to FIG. 1G, a thin layer 26 based on GaN is deposited by epitaxy on the upper surfaces of the mesas, and in particular on that of the mesas M3, in such a way as to seal the pores of the porosified lower portion 22 that open onto the upper surface. By way of example, this sealing layer 26 can be produced from InGaN with a proportion of indium of approximately 1% and of a thickness between approximately 10 and 100 nm.

Next, epitaxial regrowth portions 27 are produced on the mesas M1, M2 and M3 and in particular on that of the mesas M3. These portions 27 can have a thickness of approximately 200 nm and can be produced from InGaN with a proportion of indium in the order of approximately 8%. The epitaxial regrowth portion 27 then causes the deformation of the porosified lower portion 22 of the mesas M3 (tensile stresses), which in return make it possible for the epitaxial regrowth portions 27 to relax. In addition, the mesh parameter at the upper face of the mesas M3 is different from that of the mesas M1.

Figure 1H:
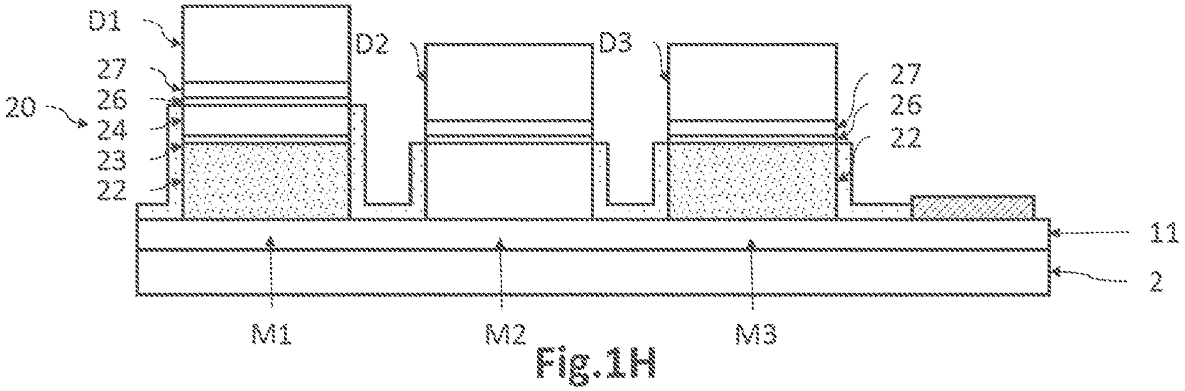

With reference to FIG. 1H, the diodes D1, D2, D3 are produced from the growth substrate 20, simultaneously, by epitaxial regrowth from the mesas M1, M2, M3. Thus, during the same epitaxial deposition step, a first portion based on n-type doped InGaN is deposited on each mesa, which will then be more or less relaxed depending on the categories M1, M2, M3 of mesas. Thus, a thickness of 200 nm of a first portion of InGaN with 8.5% of indium makes it possible to obtain an effective mesh parameter of 3.208 Å on the mesas M3. During the same deposition, on the mesas M1, the first portion includes less indium due to the upper portion 24 based on AlGaN, and on the mesas M3, the first portion includes more indium thanks to the porosified lower portion 22 and to the absence of the non-porosified upper portion 24 of AlGaN. Next, the active zone with quantum wells is produced, a second portion based on p-doped InGaN. An intermediate portion for blocking GaN or AlGaN electrons can be provided between the active zone and the second p-doped portion.

Thus, the manufacturing method makes it possible to natively produce diodes D1, D2, D3 that will emit at different wavelengths, here in the three RGB colours. This is possible due to the fact that the mesas M1, M2, M3 have different deformabilities d1, d2, d3. In addition, incorporating indium into the diodes, and in particular into the first n-doped portions then into the quantum wells of the active zones, depends indeed on the deformability of the mesas and of the effective mesh parameter. The higher the effective mesh parameter of an epitaxial regrowth portion (after producing the diodes), the longer the principal wavelength of the corresponding diode. The method for manufacturing the growth substrate 20 thus brings into play a photoelectrochemical etching step, and at least one electrochemical porosification step. Therefore, there is no need to carry out, as in the prior art mentioned above, the steps of localised ion implantation of dopants to obtain the various types of mesas.

FIGS. 2A to 2D illustrate steps of a method for manufacturing a growth substrate 20, then a matrix of diodes D1, D2, D3, according to a variant of the first embodiment, where the crystalline stack 10 includes an epitaxial regrowth intermediate layer 15 of low thickness intended to not be porosified.

Figure 2A:
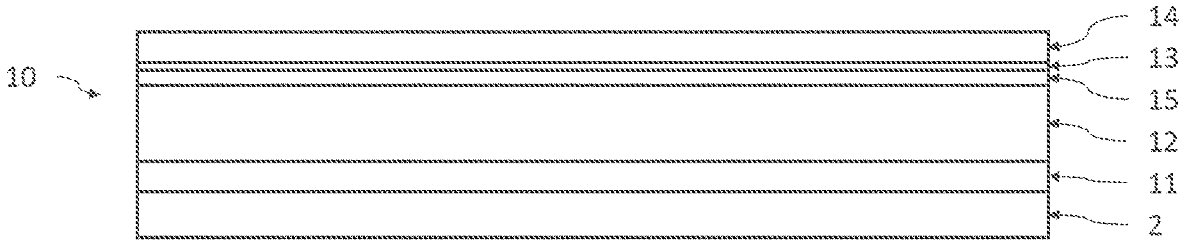
FIGS. 2A to 2D illustrate steps of a method for manufacturing a growth substrate, then a matrix of diodes, according to a variant of the first embodiment, where the crystalline stack includes an epitaxial regrowth intermediate layer of low thickness and intended to not be porosified.

With reference to FIG. 2A, a crystalline stack 10 similar to that of FIG. 1A is produced, which differs therefrom in that it includes an epitaxial regrowth intermediate layer 15, located between and in contact with the lower layer 12 and with the separation intermediate layer 13. This epitaxial regrowth intermediate layer 15 is intended to form the epitaxial regrowth portions 25 of the mesas M2 and M3 after eliminating the upper portions 24 based on AlGaN and the intermediate portions 23 based on InGaN. It can be produced based on GaN, for example made from GaN or from InGaN (with a small proportion of indium, lower than that of the intermediate layer so as not to be etched during the photoelectrochemical etching step). It is not intentionally doped, or weakly doped so as not to be porosified during the electrochemical porosification step (doping level lower than that of the lower layer 12). Its thickness is low, for example in the order of 10 nm, so as not to affect the deformability of the mesas M1 and M3.

Figure 2B:
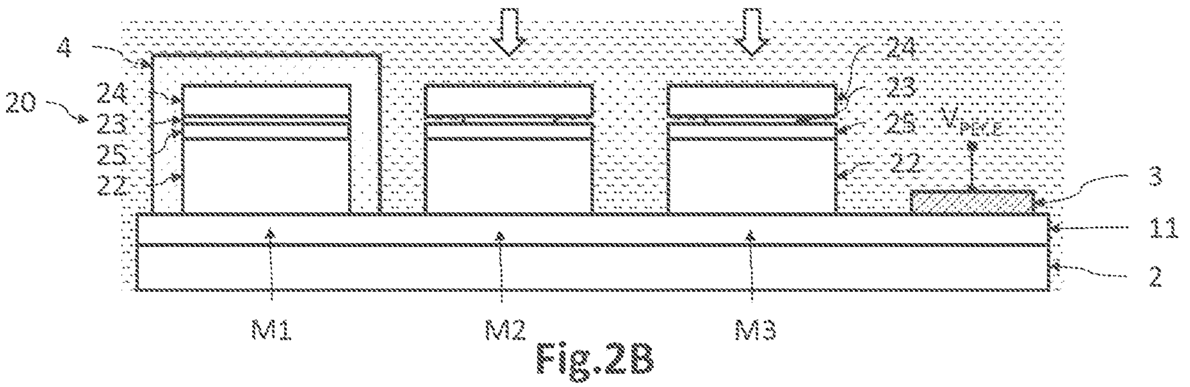

With reference to FIG. 2B, the photo-assisted electrochemical etching of the intermediate portion 23 of at least the mesas M3 and not of the mesas M1, and here also of the mesas M2, is carried out. This step is identical to that described above in connection with FIG. 1C. After this step, the upper faces of the mesas M2 and M3 are those of the epitaxial regrowth portions 25.

Figure 2C:
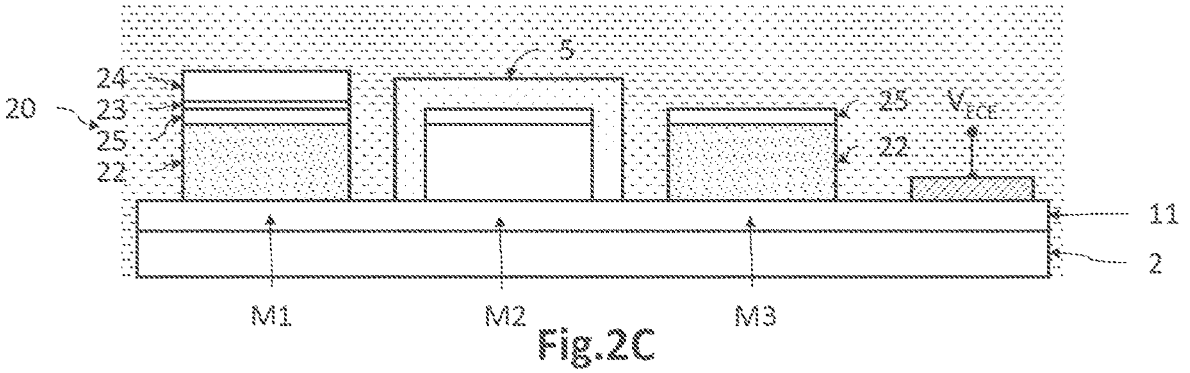

With reference to FIG. 2C, the electrochemical porosification of the lower portions 22 of only the mesas M1 and M3 and not of the mesas M2 is carried out. This step is identical to that described above in connection with FIG. 1E. Due to the composition of the material of the epitaxial regrowth portions 25 of the mesas M1 and M3 in terms of proportion of indium and doping level, these portions are not porosified (like the upper portion 24 of the mesas M1, and unlike the lower portions 22 of the mesas M1 and M3).

Figure 2D:
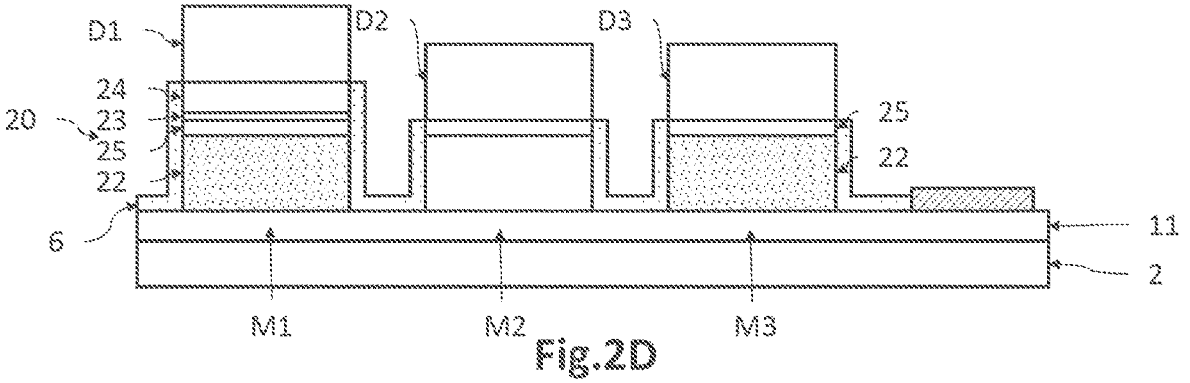

With reference to FIG. 2D, the diodes D1, D2, D3 are produced. This step is similar to that described above in connection with FIG. 1F and 1H. It should be noted that here it is not necessary to deposit a thin portion for sealing the pores on the upper face of the mesas M3, insofar as here it is formed of the epitaxial regrowth portion 25 (non-porosified) and not of the porosified lower portion 22.

FIGS. 3A to 3E illustrate steps of a method for manufacturing a growth substrate 20, then a matrix of diodes D1, D2, D3, according to another variant of the first embodiment, where the crystalline stack 10 includes an epitaxial regrowth layer 15 intended to be porosified, this having a thickness greater than that described in connection with FIG. 2A-2D.

Figure 3A:
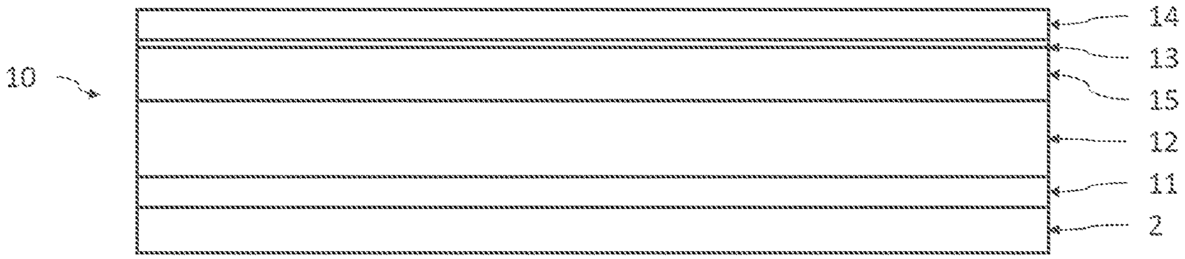
FIGS. 3A to 3E illustrate steps of a method for manufacturing a growth substrate, then a matrix of diodes, according to another variant of the first embodiment, where the crystalline stack includes an epitaxial regrowth intermediate layer intended to be porosified, and that may have a thickness greater than in the case of FIG. 2A-2D.

With reference to FIG. 3A, a crystalline stack 10 is produced similar to that of FIG. 2A, which differs therefrom in that the epitaxial regrowth intermediate layer 15, located between and in contact with the lower layer 12 and with the separation intermediate layer 13, is intended to be porosified, and may therefore have a thickness greater than that of FIG. 2A. As in FIG. 2A, it can be produced based on GaN, preferably made from InGaN with a low proportion of indium, lower than that of the intermediate layer 13 so as not to be etched during the photoelectrochemical etching step but sufficient to be porosified during the step of FIG. 3C. It is doped such that is it is not porosified during the electrochemical porosification step of FIG. 3D (lower than that of the lower layer 12). Its thickness is greater than that of FIG. 2A, for example in the order of several hundreds of nanometres. In this example, it is produced from InGaN with a proportion of indium in the order of 5 to 8%, n-type doped with a doping level between $10^{17}$ and $5\times10^{18}$ $cm^{-3}$, and of a thickness equal to approximately 200 nm.

Figure 3B:
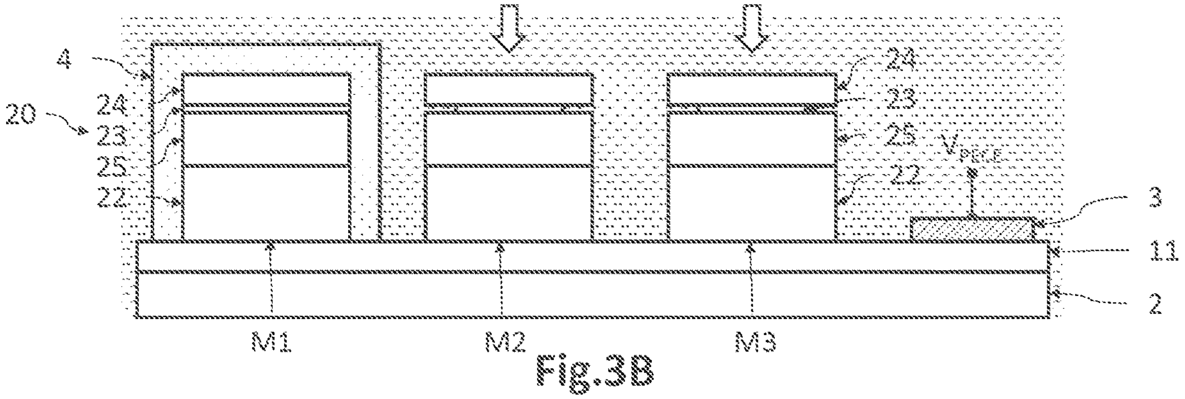

With reference to FIG. 3B, the photo-assisted electrochemical etching of the intermediate portion 23 of at least the mesas M3, here also of the mesas M2 and not of the mesas M1, is carried out. This step is identical to that of FIG. 2B. After this step, the upper faces of the mesas M2 and M3 are those of the epitaxial regrowth portions 25.

Figure 3C:
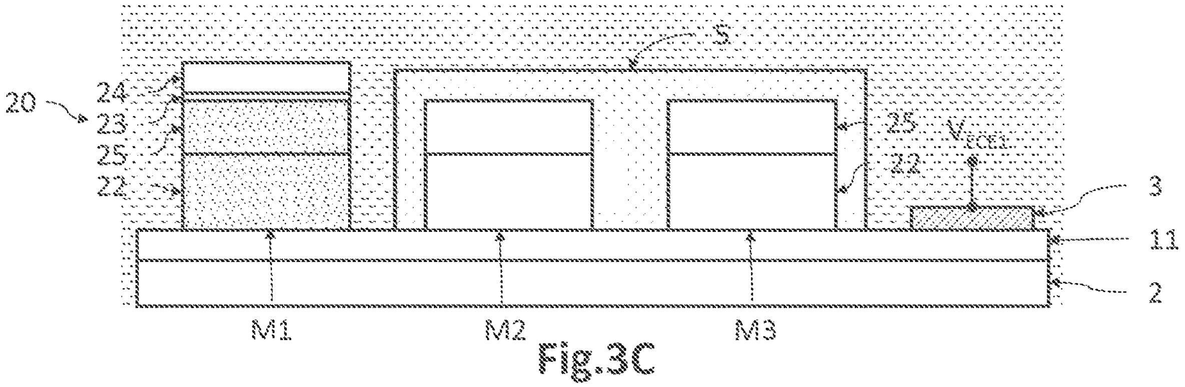

With reference to FIG. 3C, a first electrochemical porosification (non-photo-assisted) of the lower portion 22 and of the epitaxial regrowth portion 25 of only the mesas M1 is carried out. The lower portion 22 of the mesas M3 will be porosified during another electrochemical porosification step. Obviously, the two porosification steps may be reversed. The encapsulation layer 5 therefore covers the mesas M2 and M3. The growth substrate 20 is immersed in the liquid electrolyte, and the voltage $V_{ECE1}$ is applied (approximately 16 V). In addition, the lower portion 22 and the epitaxial regrowth portion 25 of the mesas M1 are porosified, and not the upper portion 24 based on AlGaN.

Figure 3D:
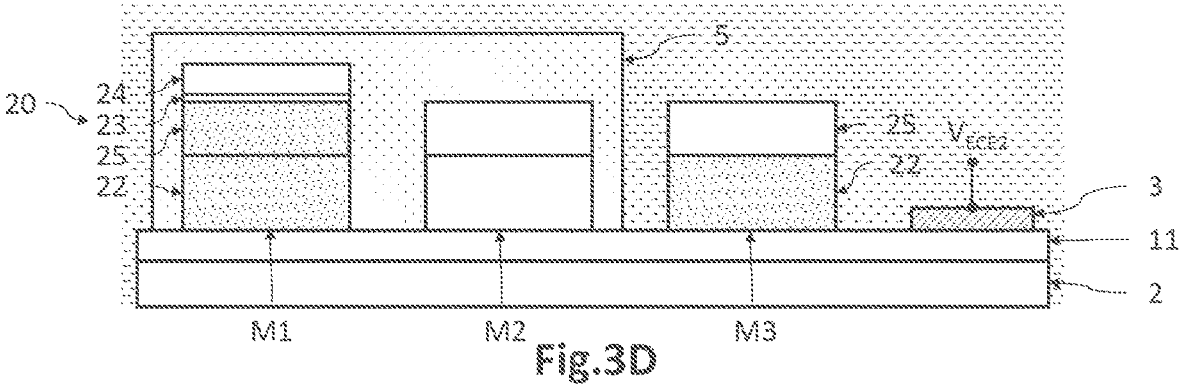

With reference to FIG. 3D, a first electrochemical porosification (non-photo-assisted) of the lower portion 22 of only the mesas M3 is next carried out. Here, the encapsulation layer 5 covers the mesas M1 and M3. A voltage $V_{ECE2}$ is applied (approximately 15 V) the value of which is lower than $V_{ECE1}$ so as to only porosify the lower portion 22 and not the epitaxial regrowth portion 25 of the mesas M3. After these two electrochemical porosification steps, the upper face of the mesas M1 is formed by the non-porosified upper portion 24 made from AlGaN, and those of the mesas M2 and M3 are formed by the non-porosified epitaxial regrowth portions 25.

Figure 3E:
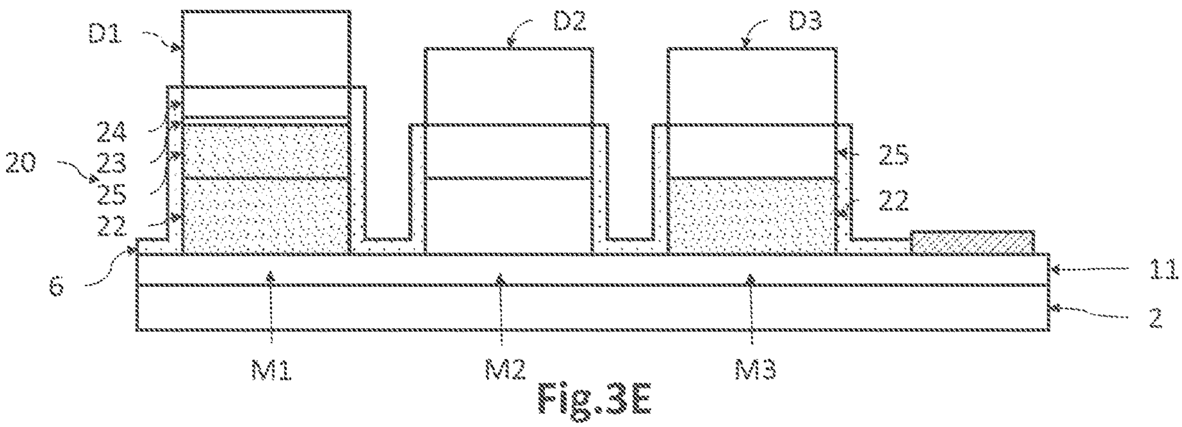

With reference to FIG. 3E, the diodes D1, D2, D3 are produced. Insofar as the upper face of one or other of the mesas is not formed by a porosified portion, it is not necessary to deposit a thin layer for sealing the pores. The production of the diodes D1, D2, D3 is carried out as described above in connection with FIG. 2D.

FIGS. 4A to 4F illustrate steps of a method for manufacturing a growth substrate 20, then a matrix of diodes D1, D2, D3, according to a second embodiment where the step of etching the upper portions 24 based on AlGaN is carried out by dry etching. In this example, the crystalline stack 10 is similar to that of FIG. 1A, but it may also be that of FIG. 2A (with an epitaxial regrowth layer 15 intended to not be porosified), like that of FIG. 3A (with an epitaxial regrowth layer 15 intended to be porosified).

Figure 4A:
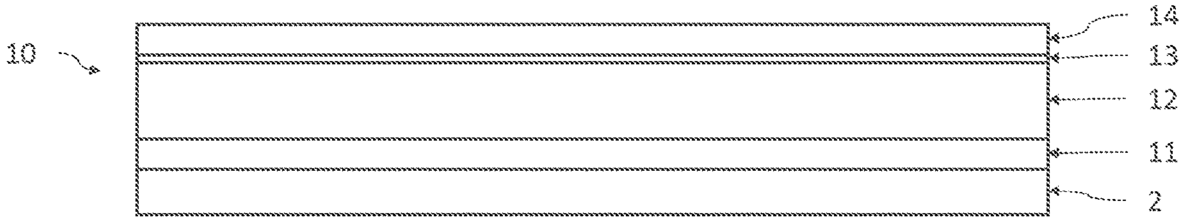
FIGS. 4A to 4F illustrate steps of a method for manufacturing a growth substrate, then a matrix of diodes, according to a second embodiment where the step of eliminating the upper portions based on AlGaN is carried out by dry etching.

With reference to FIG. 4A, a crystalline stack 10 is produced resting on the support substrate 2. Here, it is similar to that of FIG. 1A, and mainly differs in that the separation intermediate layer 13 ensures an etch stop function during the step of eliminating the upper portions 24 of at least the mesas M3 (and here also of the mesas M2). It is produced based on InGaN with a proportion of indium that is sufficient to ensure an etching selectivity at the AlGaN/InGaN interface.

Figure 4B:
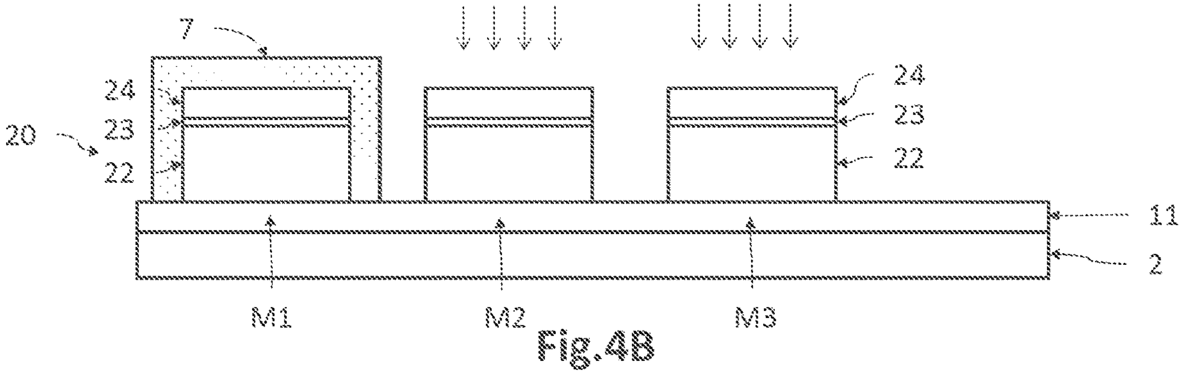

With reference to FIG. 4B, next the mesas M1, M2 and M3 are produced during a first dry etching step, for example by RIE etching with a first etching agent. Here, the etching agent is selected to be able to locally etch the upper layer 14 based on AlGaN, then the intermediate layer 13 based on InGaN, and finally the lower layer 12 based on GaN. The etching mask can be disposed here in such a way as to protect the top of the mesas.

Next, a second dry etching step, for example by RIE etching, is carried out with a second etching agent. An etching mask 7 (hard mask) is deposited to cover the mesas M1 and leave free the upper face of at least the mesas M3, and here also that of the mesas M2. It may also cover the free face of the conductive buffer layer 11. Here, the second etching agent is selected to be able to locally etch the upper portions 24 based on AlGaN of the mesas M2 and M3, and to stop on the intermediate portions 23. Next, the hard mask 7 is removed. After this step, the upper face of the mesas M1 is formed by the non-porosified upper portion 24 based on AlGaN, and those of the mesas M2 and M3 are formed by the intermediate portion 23 still present (which can be etched on a part of its thickness, depending on the operating conditions of the dry etching).

Figure 4C:
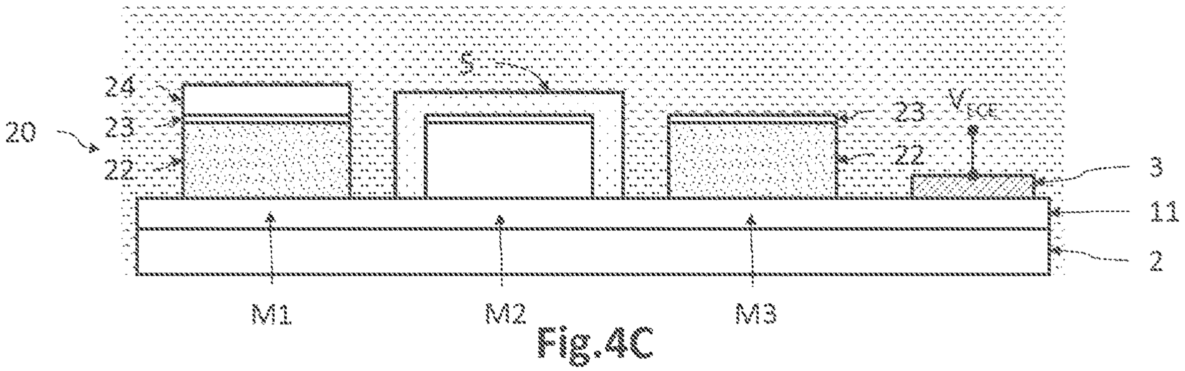

With reference to FIG. 4C, the electrochemical porosification of the lower portions 22 of only the mesas M1 and M3, and not of the mesas M2, is carried out. This step is identical to that of FIG. 1E. Beforehand, the electrode 3 is produced on and in contact with the conductive buffer layer 11. Then, the encapsulation layer 5 that covers only the mesas M2 is produced. The growth substrate 20 is immersed in the liquid electrolyte and the electrical voltage $V_{ECE}$ is applied. The lower portions 22 of the mesas M1 and M3 are porosified, and not the upper portion 24 based on AlGaN of the mesas M1. Next, the encapsulation layer 5 is removed.

Figure 4D:
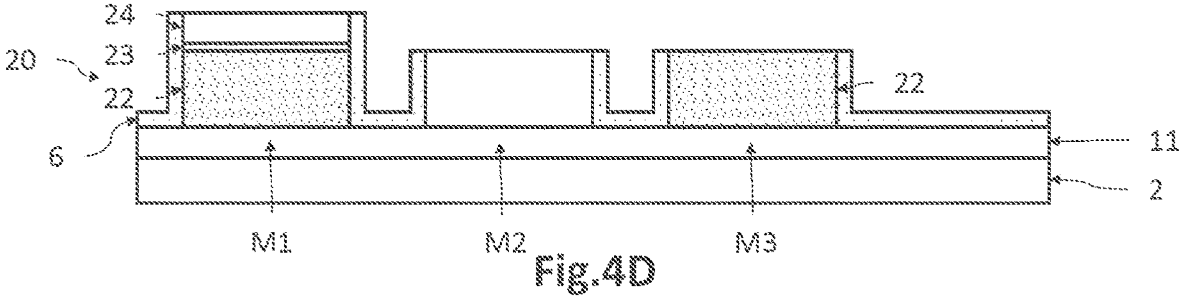

With reference to FIG. 4D, the growth mask 6 is deposited on the conductive buffer layer 11 and on the sidewalls of the mesas M1, M2, M3, leaving free a surface of the upper face of the mesas M1, M2 and M3. A cleaning anneal of the upper face of the mesas can also be carried out, for example in ammonia and at high temperature. Here, this anneal can sublimation eliminate the etch stop portions 23 of the mesas M2 and M3 that may have surface defects related to the dry etching. After this step, the upper face of the mesas M1 is formed by the non-porosified upper portion 24, that of the mesas M2 is formed by the non-porosified lower portion 22, and that of the mesas M3 is formed by the porosified lower portion 22.

Figure 4E:
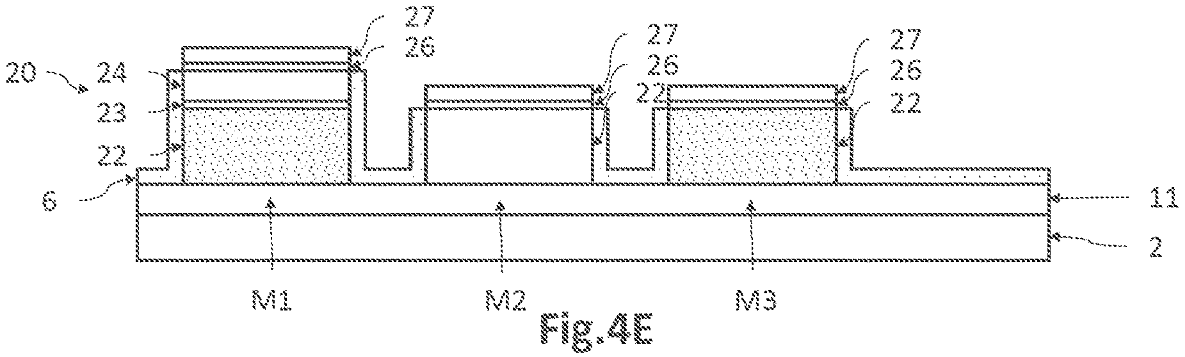

With reference to FIG. 4E, a thin sealing layer 26 based on GaN is deposited on the upper surfaces of the mesas, and in particular on that of the mesas M3, in such a way as to seal the pores of the porosified lower portion 22 that open onto the upper face. Next, the epitaxial regrowth portions 27 are produced on the mesas M1, M2 and M3 and in particular on the mesas M3.

Figure 4F:
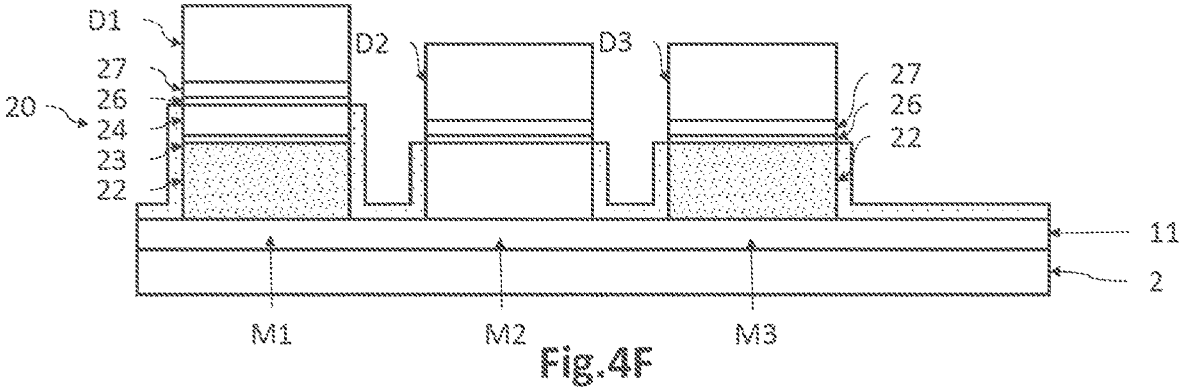

With reference to FIG. 4F, the diodes D1, D2, D3 are produced from the growth substrate 20, simultaneously, by epitaxial regrowth from the mesas M1, M2, M3, described in connection with FIG. 1H.

Particular embodiments have just been described. Various variants and modifications will appear to the person skilled in the art.

Thus, as described above, the upper portion 24 of the mesas M2 can be kept, as for the mesas M1. Moreover, the non-photo-assisted electrochemical porosification steps can be performed before the step of eliminating the upper portion 24 of at least the mesa M3. Finally, the epitaxial regrowth portions 25, 27 can be produced before or during the step of producing the diodes. When they are produced before that of the diodes, they may be porosified, in which case they have a low thickness, or they may not be porosified, in which case they may have a greater thickness.

What is claimed is:

1. A method for manufacturing a growth substrate configured to produce by epitaxy a matrix of diodes based on InGaN, including the following steps of:
   - producing a crystalline stack based on GaN, including, from a conductive buffer layer produced based on doped GaN:
   - a lower layer based on doped GaN; then
   - a separation intermediate layer, based on InGaN; then
   - an upper layer based on AlGaN;
   - producing mesas of three categories M1, M2, M3, by localised etching of the crystalline stack, each mesa then being formed of a stack of a lower portion, of a separation intermediate portion, and of an upper portion, respectively from the lower layer, from the separation intermediate layer and from the upper layer;
   - eliminating, by etching, the upper portion of at least the mesas M3, the upper portion of the mesas M1 being preserved; then
   - non-photo-assisted electrochemically porosifying the lower portions of only the mesas M1 and M3, the lower portion of the mesas M2 being non-porosified.

2. The manufacturing method according to claim 1, wherein the elimination step is performed by photoelectrochemically etching the separation intermediation portion of at least the mesas M3, the mesas M1 being covered by an encapsulation layer.

3. The manufacturing method according to claim 1, wherein the elimination step is performed by dry etching the upper portion of at least the mesas M3, with etch stop on the separation intermediate portion, the mesas M1 being covered by an etching mask.

4. Manufacturing method according to claim 1, wherein, during the step of producing the crystalline stack, an epitaxial regrowth layer is located on and in contact with the lower layer, so that, after the elimination and porosification steps, the mesas M3 have an upper face formed by an epitaxial regrowth portion from the epitaxial regrowth layer.

5. The manufacturing method according to claim 1, wherein after the step of producing the mesas, the separation intermediate portion is, in each mesa, on and in contact with the lower portion, the method including a step of producing epitaxial regrowth portions produced based on InGaN, carried out after the electrochemical porosification step, resting on the upper portion in the mesas M1, and resting on the lower portion in the mesas M3.

6. The manufacturing method according to claim 5, including, after the elimination and porosification steps and before the step of producing the epitaxial regrowth portion, a step of producing a sealing portion deposited at least on and in contact with the lower portion of the mesas M3 then porosified.

7. A method for manufacturing a matrix of diodes of categories D1, D2, D3 from a growth substrate, including the following steps of:
   - manufacturing the growth substrate by the method according to claim 1; then
   - depositing a growth mask, leaving free an upper surface of the mesas M1, M2, M3; then
   - producing the matrix of diodes D1, D2, D3, respectively from the mesas M1, M2, M3.

8. A growth substrate configured to produce by epitaxy a matrix of diodes based on InGaN, comprising:
   - a conductive buffer layer, produced based on doped GaN; and
   - mesas of three categories M1, M2, M3, resting on the conductive buffer layer, each mesa including a lower portion produced based on doped GaN; wherein
     - the mesas M1 comprising a lower portion that is porous, and further include a non-porous separation intermediate portion produced based on InGaN, resting on the porous lower portion; and a non-porous upper portion produced based on AlGaN over the separation intermediate portion;
     - the mesas M2 being formed of the lower portion, the lower portion of the mesas M2 being non-porous; and
     - the mesas M3 being formed of the lower portion, the lower portion of the mesas M3 being porous, and the mesas M3 do not include a non-porous upper portion produced based on AlGaN resting on the lower portion.

9. The growth substrate according to claim 8, wherein each mesa M1, M2, M3 includes a non-porous epitaxial regrowth portion produced based on doped InGaN, resting, in the mesas M1, on the non-porous upper portion of the mesas M1, and, in the mesas M3, on the lower portion.

10. The growth substrate according to claim 9, wherein each mesa M1, M2, M3 includes a non-porous sealing portion produced based on GaN, located, in the mesas M1, between and in contact with the non-porous upper portion of the mesas M1 and with the epitaxial regrowth portion, and in the mesas M3, between and in contact with the lower portion and with the epitaxial regrowth portion.

11. The growth substrate according to claim 8, wherein each mesa M1, M2, M3 includes an epitaxial regrowth intermediate portion produced based on InGaN and located, in the mesas M1, between the lower portion and the separation intermediate portion, in the mesas M3, on the lower portion.

12. The growth substrate according to claim 11, wherein the epitaxial regrowth intermediate portion of each mesa M1, M2, M3 is non-porous.

13. The growth substrate according to claim 11, wherein the epitaxial regrowth intermediate portion is porous in the mesas M1, and non-porous in the mesas M2 and M3.

* * * * *